United States Patent [19]

Yamamoto et al.

[11] Patent Number: 4,773,076

[45] Date of Patent: Sep. 20, 1988

[54] INTERNAL REFLECTOR INTERFEROMETRIC SEMICONDUCTOR LASER DEVICE

[75] Inventors: Saburo Yamamoto; Osamu Yamamoto, both of Nara; Hiroshi Hayashi, Kyoto, all of Japan

[73] Assignee: Sharp Kabushiki Kaisha, Osaka, Japan

[21] Appl. No.: 878,423

[22] Filed: Jun. 25, 1986

[30] Foreign Application Priority Data

Jun. 26, 1985 [JP] Japan ................................ 60-141376

[51] Int. Cl.⁴ ............................................... H01S 3/19
[52] U.S. Cl. ........................................ 372/50; 372/46;
372/48; 372/92
[58] Field of Search ....................... 372/50, 44, 45, 46,
372/48, 92

[56] References Cited

U.S. PATENT DOCUMENTS

| | | | |
|---|---|---|---|
| 4,562,569 | 12/1985 | Yariv et al. | 372/50 |
| 4,608,697 | 8/1986 | Coldren | 372/50 |
| 4,679,200 | 7/1987 | Matsui | 372/48 |

FOREIGN PATENT DOCUMENTS 0034089  2/1985  Japan .................................. 372/48

Primary Examiner—James W. Davie
Attorney, Agent, or Firm—Ciotti & Murashige, Irell & Manella

[57] ABSTRACT

A semiconductor laser device in which a double-heterostructure multi-layered crystal containing an active layer for laser oscillation is formed on a single crystal substrate having a channel composed of alternate channel portions with different widths and lengths, resulting in a plurality of alternate optical waveguides in said active layer corresponding to said alternate channel portions, said optical waveguides being optically coupled therebetween but being electrically separated from each other.

3 Claims, 4 Drawing Sheets

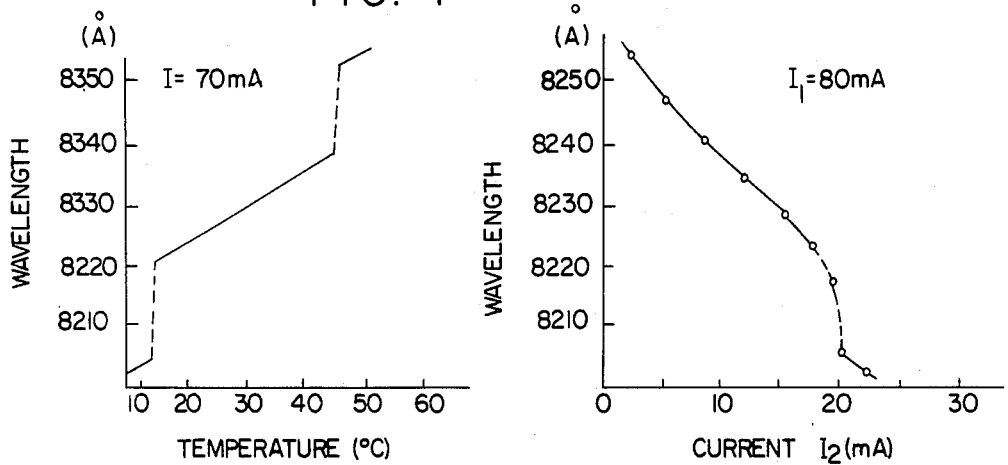
FIG. 4
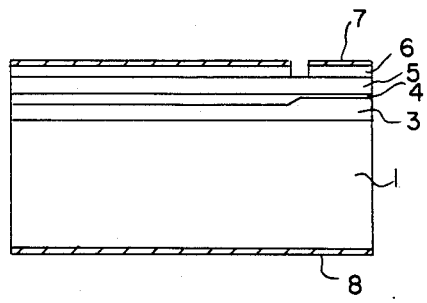
FIG. 5
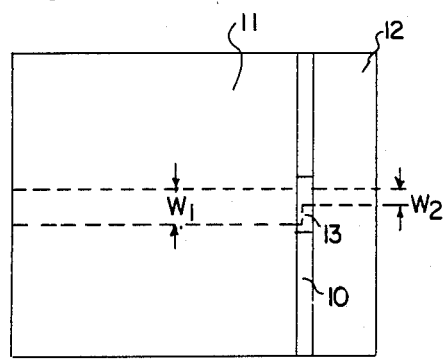 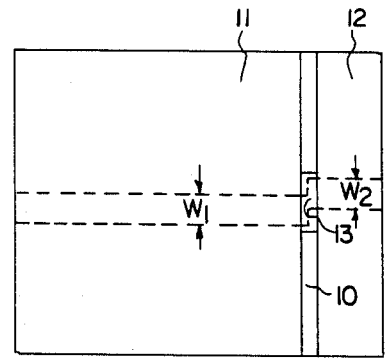
FIG. 6A          FIG. 6B

INTERNAL REFLECTOR INTERFEROMETRIC SEMICONDUCTOR LASER DEVICE

BACKGROUND OF THE INVENTION

1. Field of the invention:

This invention relates to a multi-terminal semiconductor laser device which attains laser oscillation with a stabilized oscillation wavelength and which allows changes in the oscillation wavelength.

2. Description of the prior art:

With enlarged-applications in such fields as optical communication systems, optical-measuring systems, optical information processing systems, semiconductor lasers, etc., semiconductor laser which oscillate laser light with a stabilized oscillation wavelength are required. In order to achieve an optical communication mode with wavelength superposition, frequency modulation (FM) or the like, semiconductor lasers allowing the oscillation wavelength to vary are also required. For these reasons, semiconductor lasers such as distributed feedback (DFB) lasers, distributed Bragg reflector (DBR) lasers, internal reflector interferometric lasers, compound resonator type lasers, external resonator type lasers, etc., have been studied. However, skilled workers are required for the formation of diffraction gratings of the DFB lasers and the DBR lasers. Moreover, structures and the production process of the internal reflector interferometric lasers, compound resonator type lasers, and external resonator type lasers are complicated, and it is difficult to put them into practical use.

SUMMARY OF THE INVENTION

The multi-terminal semiconductor laser device of this invention, which overcomes the above-discussed and numerous other disadvantages and deficiencies of the prior art, is a semiconductor laser device in which a double-heterostructure multi-layered crystal containing an active layer for laser oscillation is formed on a single crystal substrate having a channel composed of alternate channel portions with different widths and lengths, resulting in a plurality of alternate optical waveguides in said active layer corresponding to said alternate channel portions, said optical waveguides being optically coupled therebetween but being electrically separated from each other.

In a preferred embodiment, the central axis of one of said channel portions is different from that of the adjacent channel portion, but a part of the channel portion is in common with that of the adjacent channel portion. Alternatively, the central axes of said channel portions are in common and one of said channel portions which is narrower than the other channel portions is located in the central area of the channel.

The basic conception of this invention is as follows: As semiconductor lasers in which a heterostructure multi-layered crystal containing and active layer is grown on a single crystal channeled substrate, resulting in an optical waveguide having an effective refractive index in the active layer, there have been channel-substrate planar structure injection (CSP) lasers, V-channeled substrate inner strips (VSIS) lasers, etc. FIG. 8 shows a conventional VSIS laser which successively comprises a p-GaAs substrate 1, an n-GaAs current blocking layer 2, a p-GaAlAs cladding layer 3, a GaAlAs active layer 4, an n-GaAlAs cladding layer 5, and an n-GaAs cap layer 6. Reference numeral 7 is an n-sided electrode and reference numeral 8 is a p-sided electrode. A V-channel 9 having the width W is formed in the current blocking layer 2 in a manner to reach the substrate 1, resulting in a current path. Current injected into this device is blocked by the current blocking layer 2, and flows through the current path (i.e., the channel 9) alone. Laser light produced in the active layer 4 is absorbed by the n-current blocking layer 2 outside of the channel 9 resulting in a decrease in the effective refractive index, so that the portion of the active layer 4 corresponding to the channel 9 having the width W forms an optical waveguide. This device functions as a resonator which utilizes reflections on both facets Q thereof.

According to the semiconductor laser device of this invention, the width W of the waveguide is changed in the resonator direction, resulting in an internal reflection of laser light thereon. Due to an interference effect arising between the reflected light resulting from the internal reflection and the reflected light resulting from each of the facets, a stable longitudinal mode can be selected. Moreover, control of each of currents to be injected into the electrode regions which correspond to the different optical waveguide widths allows the selection of longitudinal modes.

FIGS. 1(A) and 1(B) show a semiconductor laser of this invention in which a groove 10 electrically separates the n-sided electrode 7 into two regions, one of which is the region 7a containing the V-channel portion with the width $W_1$ and the length $L_1$ in the resonator direction and the other of which is the region 7b containing the V-channel portion with the width $W_2$ and the length $L_2$ ($L_1 \neq L_2$) in the resonator direction. FIGS. 1(A) and 1(B) show a case in which $W_1 > W_2$. However, this invention is of course applicable to cases in which $W_1 < W_2$. The groove 10 is formed in a manner to reach an area below the active layer 4, except for the central area 11 which is formed by removing the electrode 7 alone or the electrode 7 and the cap layer 6. Thus, the optical waveguides corresponding to the regions 7a and 7b are optically coupled therebetween, but they are electrically separated from each other. FIG. 1(C) shows the distributions of optical intensity in the direction parallel to the active layer 4, wherein the curve a is the distribution of optical intensity in the region 7a and the curve b is the distribution of optical intensity in the region 7b. When these two modes (transverse modes) in the transverse direction are coupled therebetween at the interface area 11, an internal reflection of laser light occurs. Thus, laser light travels back and forth over each of the three cavity lengths $L_1$, $L_2$, and $L_1+L_2$, resulting in three kinds of longitudinal modes in the longitudinal direction, which create an interference effect therebetween. As a result, a specific longitudinal mode alone obtains great gain and the other longitudinal modes are suppressed.

Given that the oscillation wavelength of laser light oscillated in a longitudinal mode is $\lambda_0$ and the effective refractive indexes of the active layer 4 corresponding to the regions 7a and 7b are $n_1$ and $n_2$, respectively, the following equation (1) can be obtained:

$$2(n_1 \cdot L_1 + n_2 \cdot L_2) = m\lambda_0 \quad (1)$$

wherein m is the integer.

The effective refractive indexes $n_1$ and $n_2$ vary depending upon the thickness d of the active layer 4, the width W of the waveguide, the injected carrier density $N_1$, etc. An internal reflection of laser light occurs at the interface between the regions of the active layer having different effective refractive indexes. In the example shown in FIG. 1, since the two regions are different in waveguide width, an internal reflection occurs therebetween and an interference effect arises between three kinds of longitudinal modes resulting from the cavity lengths $L_1+L_2$, $L_1$, and $L_2$, so that the selection of a specific longitudinal mode $\lambda_0$ can be attained and longitudinal modes other than the specific longitudinal mode $\lambda_0$ are suppressed. The specific longitudinal mode $\lambda_0$ obtained is extremely stable despite changes in temperature and/or currents $I_1$ and $I_2$ injected into the regions 7a and 7b, respectively.

Moreover, when the current $I_1$ injected into the region 7a is maintained at a fixed value and the current $I_2$ injected into the region 7b is increased, the density $N_2$ of carrier injected into the active layer positioned in the region 7b increases while the effective refractive index $n_2$ decreases. Therefore, the oscillation wavelength $\lambda_0$ in the equation (1) becomes small. That is, when the current $I_2$ is increased, the oscillation wavelength $\lambda_0$ of laser light in a longitudinal mode can be shifted to the shorter wavelength side.

Thus, the invention described herein makes possible the objects of (1) providing an internal reflector interferometric laser device having a high quality multi-terminal structure which is produced by a simplified process; and (2) a multi-terminal semiconductor laser device in which two kinds of optical waveguides are formed in a manner to be electrically separated but optically coupled therebetween and an internal reflection arises at the interface between these optical waveguides resulting in an interference effect by which laser light in a specific longitudinal mode alone can be selected, so that the device can oscillate laser light with a stabilized wavelength over a wide range of injected currents and/or temperatures and the device allows changes in the laser light wavelength by changing the amount of one of the currents injected.

BRIEF DESCRIPTION OF THE DRAWINGS

This invention may be better understood and its numerous objects and advantages will become apparent to those skilled in the art by reference to the accompanying drawings as follows:

FIG. 4(A) is a graph showing the dependence of the oscillation wavelength on temperatures with regard to the semiconductor laser device produced by the process shown in FIGS. 2(A) to 2(D).

FIG. 4(B) is a graph showing a variation in the oscillation wavelength of the semiconductor laser device shown in FIG. 2(D) when current $I_2$ injected is varied.

FIG. 5 is a side sectional view showing another semiconductor laser device of this invention having a concaved active layer.

FIGS. 6(A) and 6(B), respectively, are plane views showing another semiconductor laser device of this invention, in which the central axis of one channel portion is different from that of the adjacent channel portion.

DESCRIPTION OF THE PREFERRED EMBODIMENTS

EXAMPLE 1

Figure 1A:
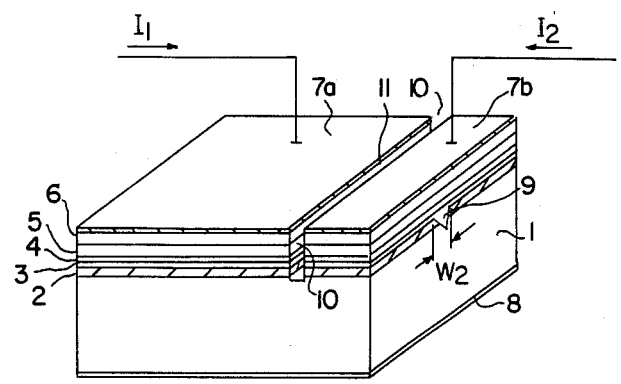
FIGS. 1(A) and 1(B), respectively, are a perspective view and a plane view showing a semiconductor laser device of this invention.
Figure 1B:
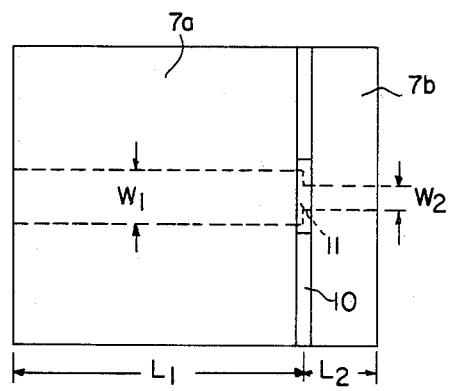
Figure 1C:
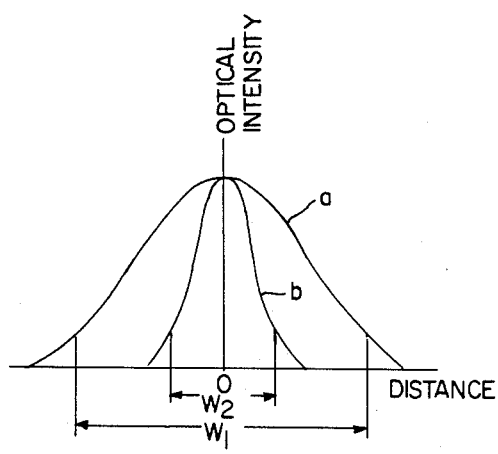
FIG. 1(C) is a graph showing the distribution of optical intensity in the direction parallel to the active layer of the semiconductor laser device shown in FIG. 1(A) or 1(B).
Figure 2A:
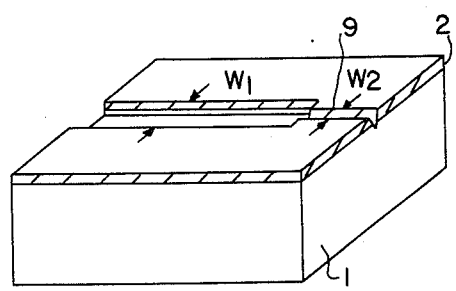
FIGS. 2(A) to 2(D) are schematic diagrams showing a process for the production of the semiconductor laser device shown in FIGS. 1(A) and 1(B).
Figure 2B:
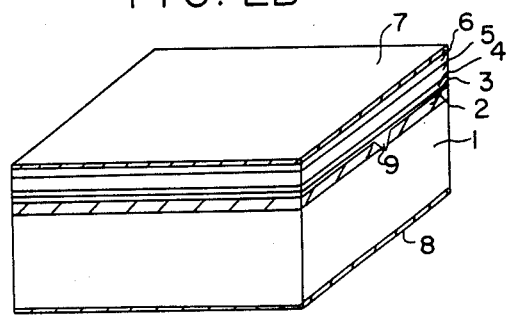
Figure 2C:
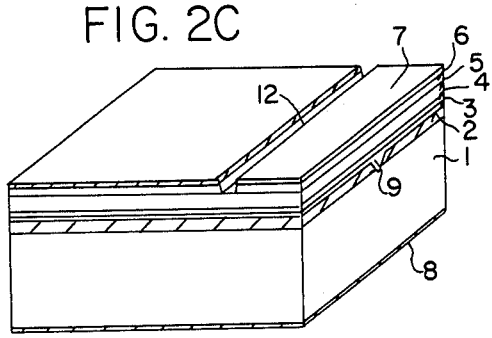
Figure 2D:
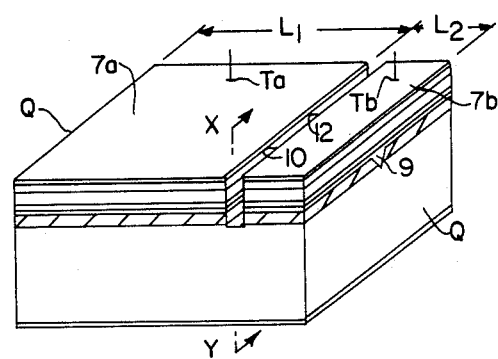
Figure 3:
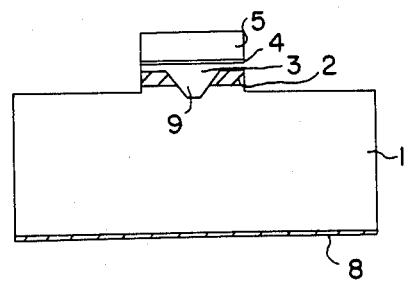
FIG. 3 is a front sectional view on line X-Y of the semiconductor laser device shown in FIG. 2(D).

A semiconductor laser device of this invention is produced as follows: As shown in FIG. 2(A), on the (100) face of a p-GaAs substrate 1, an n-GaAs current blocking layer 2 having a carrier concentration of $3 \times 10^{18}$ cm$^{-3}$ and having a thickness of 0.6 μm is formed by liquid phase epitaxy. On the surface of the current blocking layer 2, a channel 9 composed of a channel portions having the widths $W_1$ ($=7$ μm) and $W_2$ ($=3$ μm), respectively, is continuously formed in the <110> direction on the same line in a manner to reach the substrate 1. Then, as shown in FIG. 2(B), on the current blocking layer 2 containing the channel 9, a p-Ga$_{0.6}$Al$_{0.4}$As cladding layer 3, a Ga$_{0.95}$Al$_{0.05}$As active layer 4, an n-Ga$_{0.6}$Al$_{0.4}$As cladding layer 5, and an n-GaAs cap layer 6 are successively formed by liquid phase epitaxy, resulting in a double-heterostructure multi-layered crystal for laser oscillation. Then, the upper surface of the n-GaAs cap layer 6 and the back face of the p-GaAs substrate 1 are subjected to a vapor deposition treatment with metal materials of Au-Ge-Ni and Au-Zn, respectively, followed by heating to form an n-sided electrode 7 made of an alloy of Au-Ge-Ni and a p-sided electrode 8 made of an alloy of Au-Zn, respectively, resulting in ohmic contacts thereon, respectively. Then, as shown in FIG. 2(C), a groove 12 having a width of 10 μm is formed at right angles to the channel 9 by an etching technique in such a manner that the n-sided electrode 7 and the n-GaAs cap layer 6 are removed at the interface between the channel portions having the different widths $W_1$ and $W_2$. Then, as shown in FIG. 2(D), the groove 12 is further subjected to a chemical etching treatment or a reactive ion etching (RIE) treatment to form a groove 10, which reaches below the active layer 4, except for the portion of the groove 10 having a width of 10–20 μm which is positioned above the channel 9 as shown in FIG. 3. The resulting device is cleaved at a distance of $L_1$ ($=210$ μm) in one direction from the groove 10 and at a distance of $L_2$ ($=40$ μm) in the opposite direction from the groove 10, to form a device unit having facets Q, respectively, resulting in the regions 7a and 7b. The electrical resistivity between the regions 7a and 7b was 800 Ω, which means that they are electrically separated.

The device unit is mounted on a stem in such a manner that the p-sided electrode 8 is positioned downwards. Au lead-wires are bonded on the electrode regions 7a and 7b, respectively, which constitute the n-sided electrode 7, to form terminals Ta and Tb, respectively.

When current was injected into the device through the electrode 7 via the terminals Ta & Tb and the electrode 8, laser oscillation was achieved at a threshold current of 60 mA. FIG. 4(A) shows the dependence of the oscillation wavelength on temperatures with regard to this device, indicating that the device has a stable longitudinal mode characteristic without mode-hopping over a range from 15° to 45° C.

When the current $I_1$ injected into the region 7a was maintained at 80 mA and the current $I_2$ injected into the region 7b is changed, laser oscillation was achieved with changes in the oscillation wavelength as shown in FIG. 4(B), indicating that when the current $I_2$ is changed over a range from 0 to 20 mA, the oscillation wavelength varies over a range of about 40 Å.

EXAMPLE 2

The above-mentioned example shows a case in which the area of the active layer 4 corresponding to the region 7a has the same thickness d as that of the active layer 4 corresponding to the region 7b, but is not limited thereto. The thickness of the active layer 4 can be different therebetween by, for example, curving the portion of the active layer 4 corresponding to the channel 9. In general, it is known that when the active layer is curved using liquid phase epitaxy, the thickness of the central portion of the curved active layer becomes thicker than that of the other portion. FIG. 5 shows a side sectional view of the central portion of the active layer 4 corresponding to the channel 9 wherein the active layer 4 is curved at the afore-mentioned interface area 11 thereof. With the device obtained according to this example, laser light undergoes great internal reflection at the active layer area, the thickness of which varies, so that device characteristics which are more excellent than those in Example 1 can be achieved.

EXAMPLE 3

FIGS. 6(A) and 6(B), respectively, show plane views showing other devices of this invention, in which the central axis of the channel portion in one region 7a is different from that of the channel portion in the other region 7b, but a part of the channel portion in the region 7a is in common with that of the channel portion in the region 7b. FIG. 6(A) shows the case in which $W_1 > W_2$ and FIG. 6(B) shows the case in which $W_1 = W_2$. In both cases, the position of the peak of the optical intensity in one region is different from that of the peak of the optical intensity in the other region. Thus, when the laser lights derived from these regions are coupled therebetween at the active laser corresponding to the interface 13 between these regions, internal reflection occurs. These devices attain the selection of a stable longitudinal mode by utilizing this internal reflection.

EXAMPLE 4

This example relates to devices in which a central portion of the channel is narrower that the other portions of the channel.

Figure 7A:
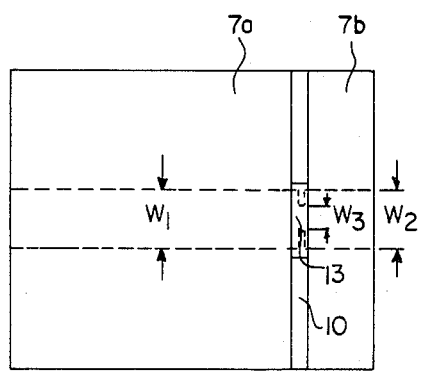
FIGS. 7(A) and 7(B), respectively, are a plane view showing another semiconductor laser device of this invention in which the central axes of the channel portions are in common with each other.

FIG. 7(A) shows another device of this invention in which the width $W_1$ of the channel portion in the region 7a is the same as the width $W_2$ of the channel portion in the region 7b, wherein $W_1 = W_2 = 7$ μm, and the width $W_3$ of the central portion is narrower than the widths $W_1$ and $W_2$ of the other portions, wherein $W_3 = 3$ μm. The length of said narrow channel portion is preferably set at a value ranging from 3 to 10 μm. An internal reflection arises at the active layer 4 corresponding to the narrow channel portion. This device attains excellent laser device characteristics due to the internal reflection as mentioned above.

Figure 7B:
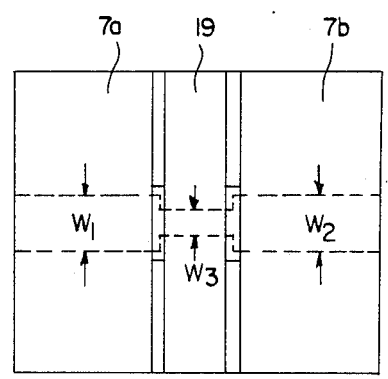
Figure 8:
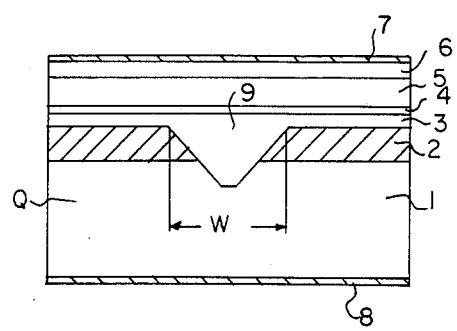
FIG. 8 is a front sectional view showing a conventional VSIS laser.

FIG. 7(B) shows another device of this invention having the same channel structure as the device shown in FIG. 7(A), except that the length of the narrow channel portion is set at as long as about 50 μm. This device is a triple-terminal device by which control of current injected into a third region 19, which is located between the regions 7a and 7b and which corresponds to the narrow channel portion, allows control of the oscillation wavelength.

A multi-terminal semiconductor laser device of this invention is not limited to devices of GaAs-GaAlAs systems, but it is applicable to heterostructure laser devices of InP-InGaAsP systems, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In an internal reflector interferometric semiconductor laser device in which a double-heterostructure multilayered crystal containing an active layer for laser oscillation is formed on a single crystal substrate having a channel, the device wherein said channel is composed of a plurality of channel portions which are positioned in a row along the longitudinal direction and which are different in width and length from each other, resulting in a plurality of alternate optical waveguides in said active layer corresponding to said channel portions, said optical waveguides being optically coupled therebetween but being electrically separated from each other.

2. An internal reflector interferometric semiconductor laser device according to claim 1, wherein the central axis of one of said channel portions is different from that of the adjacent channel portion, but the channel portion and the adjacent channel portion have a common boundary portion.

3. An internal reflector interferometric semiconductor laser device according to claim 1, wherein the central axes of said channel portions are in common and one of said channel portions which is narrower than the other channel portions is located in the central area of the channel.

* * * * *